United States Patent
Sim et al.

(10) Patent No.: US 11,107,636 B2
(45) Date of Patent: Aug. 31, 2021

(54) MULTILAYER CAPACITOR AND BOARD HAVING THE SAME MOUNTED THEREON

(71) Applicant: SAMSUNG ELECTRO-MECHANICS CO., LTD., Suwon-si (KR)

(72) Inventors: Won Chui Sim, Suwon-si (KR); Young Ghyu Ahn, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/878,985

(22) Filed: May 20, 2020

(65) Prior Publication Data

US 2021/0074480 A1  Mar. 11, 2021

(30) Foreign Application Priority Data

Sep. 10, 2019 (KR) .................. 10-2019-0112385

(51) Int. Cl.
*H01G 4/248* (2006.01)
*H01G 4/30* (2006.01)
(Continued)

(52) U.S. Cl.
CPC .............. *H01G 4/248* (2013.01); *H01G 4/30* (2013.01); *H05K 1/111* (2013.01); *H05K 1/181* (2013.01);
(Continued)

(58) Field of Classification Search
CPC .......... H01G 4/248; H01G 4/30; H05K 1/111; H05K 1/181; H05K 2201/10015; H05K 2201/10636
(Continued)

(56) References Cited

U.S. PATENT DOCUMENTS

2011/0056735 A1  3/2011  Lee et al.
2014/0196936 A1  7/2014  Hong et al.
(Continued)

FOREIGN PATENT DOCUMENTS

JP       4849123 B2    1/2012
JP    2012-204572 A   10/2012
(Continued)

OTHER PUBLICATIONS

Korean Office Action dated Nov. 6, 2020 issued in Korean Patent Application No. 10-2019-0112385 (with English translation).

*Primary Examiner* — Sherman Ng
(74) *Attorney, Agent, or Firm* — Morgan, Lewis & Bockius LLP

(57) ABSTRACT

A multilayer capacitor includes a capacitor body having first and second surfaces, third and fourth surfaces connected to the first and second surfaces, and a fifth surface and a sixth surface connected to the first and second surfaces and the third and fourth surfaces, the capacitor body including a dielectric layer and internal electrodes having one ends exposed through the third and fourth sides, respectively, and first and second external electrodes including first and second connection portions disposed on the third and fourth surfaces, respectively, and first and second band portions extending from the first and second connection portions to portions of the fifth and sixth surfaces respectively. A first distance, along one of the fifth and sixth surfaces, between the first and second external electrodes, is less than a second distance, along one of the first and second surfaces, between the first and second external electrodes.

10 Claims, 6 Drawing Sheets

(51) Int. Cl.
    *H05K 1/11*         (2006.01)
    *H05K 1/18*         (2006.01)
    *H01G 4/12*         (2006.01)

(52) U.S. Cl.
    CPC . *H01G 4/1227* (2013.01); *H05K 2201/10015* (2013.01); *H05K 2201/10636* (2013.01)

(58) Field of Classification Search
    USPC ...................................................... 361/301.4
    See application file for complete search history.

(56) References Cited

U.S. PATENT DOCUMENTS

| | | | |
|---|---|---|---|
| 2016/0211074 A1* | 7/2016 | Gu | H01G 4/012 |
| 2018/0020545 A1* | 1/2018 | Ahn | H01G 4/018 |
| 2018/0137979 A1* | 5/2018 | Kim | H01G 2/06 |

FOREIGN PATENT DOCUMENTS

| | | |
|---|---|---|
| JP | 2015-026730 A | 2/2015 |
| JP | 5769487 B2 | 8/2015 |
| KR | 10-2011-0027321 A | 3/2011 |
| KR | 10-2014-0091926 A | 7/2014 |

\* cited by examiner

MULTILAYER CAPACITOR AND BOARD HAVING THE SAME MOUNTED THEREON

CROSS-REFERENCE TO RELATED APPLICATION(S)

This application claims the benefit under 35 USC 119(a) of Korean Patent Application No. 10-2019-0112385 filed on Sep. 10, 2019 in the Korean Intellectual Property Office, the entire disclosures of which are incorporated herein by reference for all purposes.

TECHNICAL FIELD

The present disclosure relates to a multilayer capacitor and a board having the same mounted thereon.

BACKGROUND

As a multilayer electronic component, a multilayer capacitor is formed of a dielectric material, the dielectric material is piezoelectric and thus may be modified in synchronization with applied voltage.

When the period of the applied voltage is within the audible frequency band, the displacement becomes vibrations and are transmitted to the substrate through solders, and the vibration of the substrate is audible as sound. This sound is known as acoustic noise.

Such acoustic noise may be perceived as malfunctioning of the device by the user due to an abnormal sound when the operating environment of the device is quiet.

In addition, in a device having a voice circuit, the acoustic noise may be superimposed on the voice output to reduce the quality of the device.

In addition, apart from acoustic noise perceived by the human ear, when the piezoelectric vibrations of the multilayer capacitor are generated in a high frequency region of 20 kHz or more, malfunctioning of various sensors used in IT and industrial/electric and electronics devices may be caused.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide a multilayer capacitor and a board having the multilayer capacitor mounted thereon, in which acoustic noise in an audible frequency region of less than 20 kHz and high frequency vibration of 20 kHz or more may be reduced.

According to an aspect of the present disclosure, a multilayer capacitor includes a capacitor body having first and second surfaces opposing each other, third and fourth surfaces connected to the first and second surfaces and opposing each other, and a fifth surface and a sixth surface connected to the first and second surfaces, connected to the third and fourth surfaces and opposing each other, the capacitor body including a dielectric layer and first and second internal electrodes having one ends exposed through the third and fourth sides, respectively, and first and second external electrodes including first and second connection portions disposed on the third and fourth surfaces of the capacitor body, respectively, and first and second band portions extending from the first and second connection portions to portions of the fifth and sixth surfaces of the capacitor body, respectively. A first distance, along one of the fifth and sixth surfaces, between the first and second external electrodes, is less than a second distance, along one of the first and second surfaces, between the first and second external electrodes.

According to an aspect of the present disclosure, a board having a multilayer capacitor mounted thereon includes a substrate including first and second electrode pads on one surface thereof, and a capacitor body having first and second surfaces opposing each other, third and fourth surfaces connected to the first and second surfaces and opposing each other, and a fifth surface and a sixth surface connected to the first and second surfaces, connected to the third and fourth surfaces and opposing each other, the capacitor body including a dielectric layer and first and second internal electrodes having one ends exposed through the third and fourth sides, respectively, and first and second external electrodes including first and second connection portions disposed on the third and fourth surfaces of the capacitor body, respectively, and first and second band portions extending from the first and second connection portions to portions of the fifth and sixth surfaces of the capacitor body, respectively. A first distance, along one of the fifth and sixth surfaces, between the first and second external electrodes, is less than a second distance, along one of the first and second surfaces, between the first and second external electrodes. The capacitor body is disposed on the first and second electrode pads. The board further includes a first solder connecting the first connection portion and the first electrode pad to each other, and a second solder connecting the second connection portion and the second electrode pad to each other.

A length of each of the first band portion and the second band portion may be from $0.15 \times L0$ to $0.4 \times L0$, in which L0 is a length of the multilayer capacitor in a direction connecting the third and fourth surfaces.

The first distance between the first band portion and the second band portion may be from $0.2 \times L0$ to $0.7 \times L0$, in which L0 is a length of the multilayer capacitor in a direction connecting the third and fourth surfaces.

The first and second external electrodes may further include third and fourth band portions extending from the first and second connection portions to portions of the first surface of the capacitor body, respectively. Lengths of the first and second band portions may be greater than lengths of the third and fourth band portions, respectively.

A ratio of the length of the third band portion to the length of the first band portion, and a ratio of the length of the fourth band portion to the length of the second band portion may be each greater than 0.13 and less than 0.67.

A distance between the first band portion and the second band portion may be $0.2 \times L0$ to $0.8 \times L0$.

The first and second external electrodes may further include a plating layer.

Each of the entire first surface and the entire second surface may be exposed from the first and second external electrodes.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Figure 1:
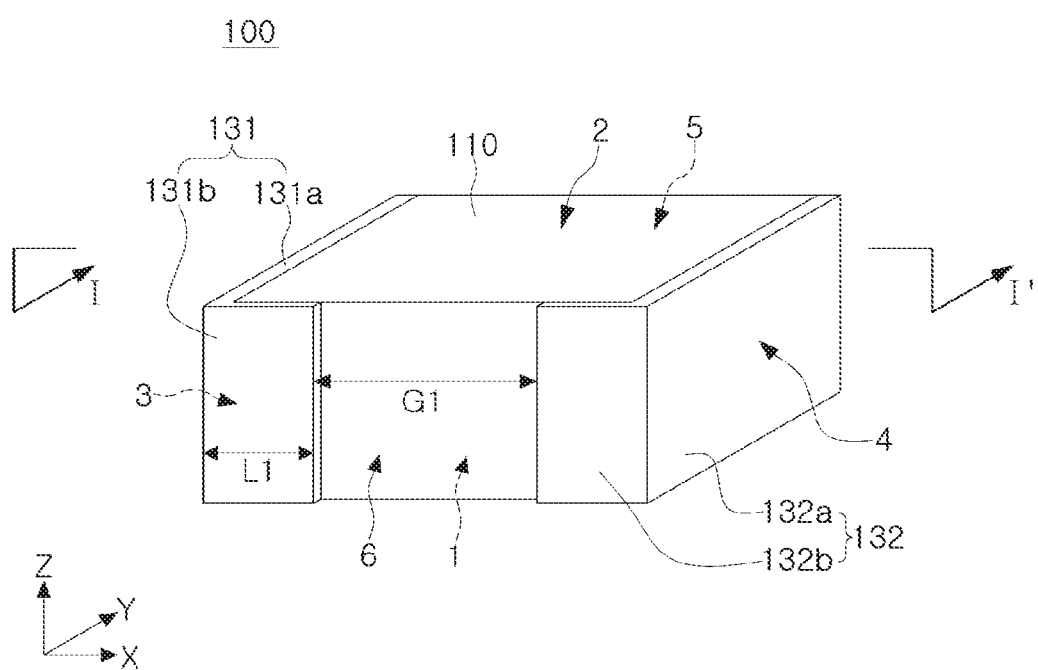
FIG. 1 is a perspective view schematically illustrating a multilayer capacitor according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

Subsequently, examples are described in further detail with reference to the accompanying drawings.

Hereinafter, when defining the direction of a capacitor body 110 to clearly describe the embodiment of the present disclosure, X, Y and Z illustrated in the drawing indicates the length direction, width direction and thickness direction of the capacitor body 110, respectively. In addition, in this embodiment, the Z direction may be used in the same concept as the stacking direction in which dielectric layers are stacked.

Figure 2A:
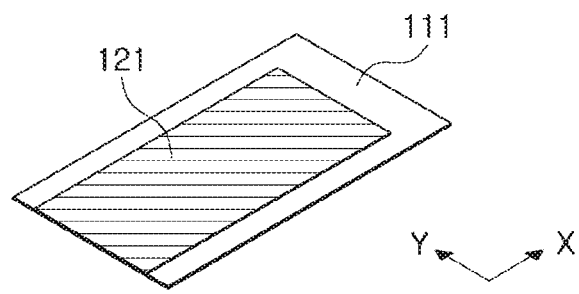
FIGS. 2A and 2B are plan views illustrating structures of first and second internal electrodes in FIG. 1, respectively.
Figure 2B:
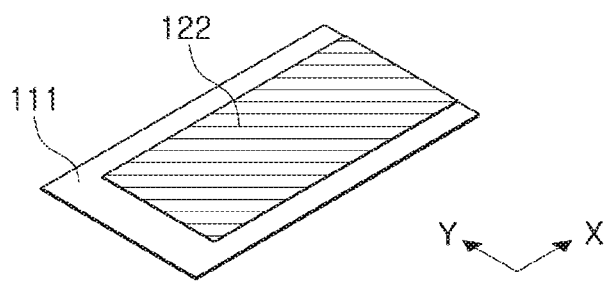
Figure 3:
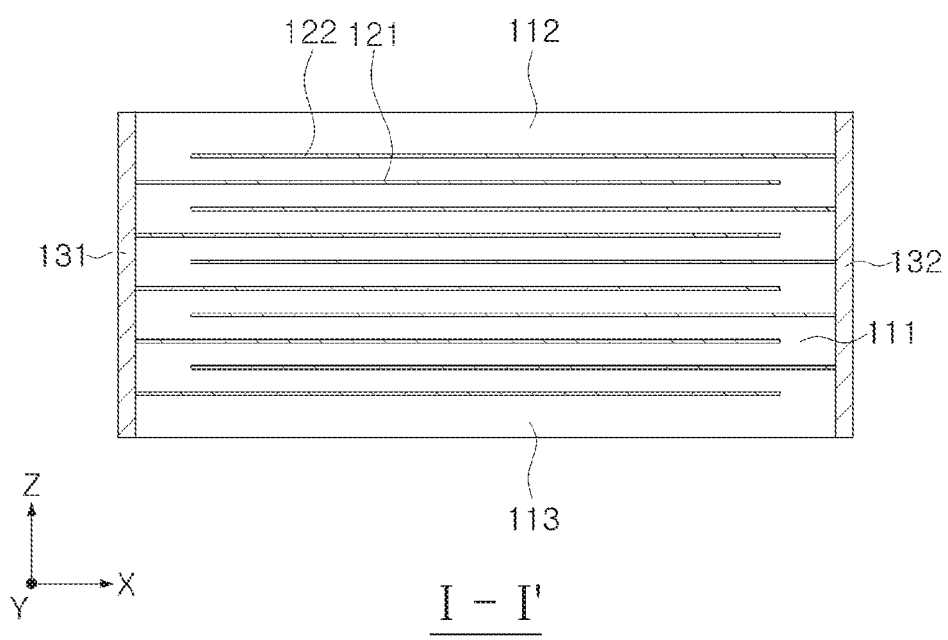
FIG. 3 is a cross-sectional view taken along line I-I' of FIG. 1.
Figure 4:
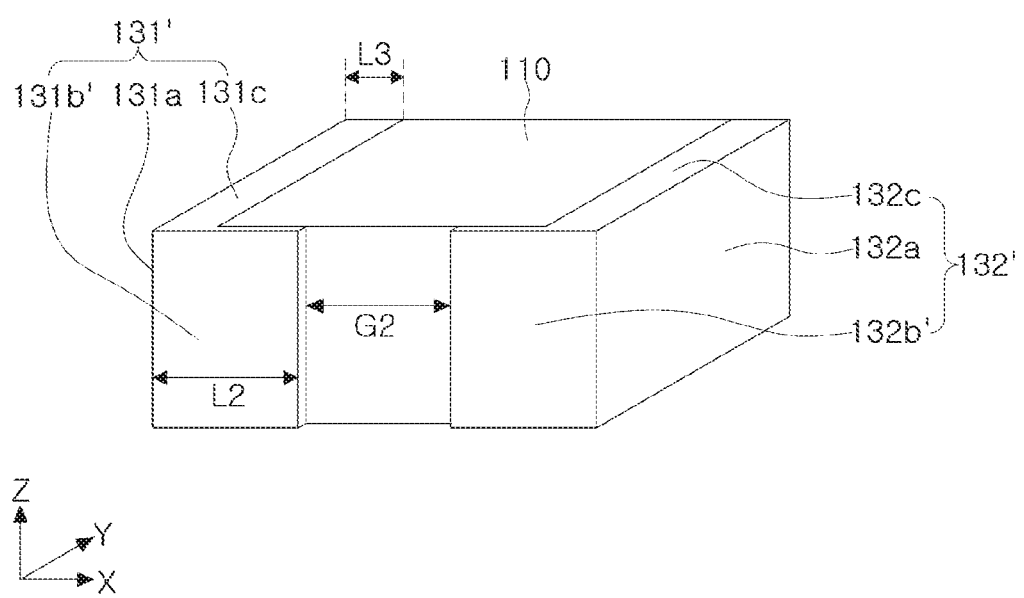
FIG. 4 is a cross-sectional view of a multilayer capacitor according to another embodiment.

FIG. 1 is a perspective view schematically illustrating a multilayer capacitor according to an embodiment, FIGS. 2A and 2B are plan views illustrating structures of first and second internal electrodes in FIG. 1, FIG. 3 is a cross-sectional view taken along line I-I' of FIG. 1, and FIG. 4 is a cross-sectional view of a multilayer capacitor according to another embodiment.

Referring to FIGS. 1 to 4, a multilayer capacitor 100 according to an embodiment includes a capacitor body 110 and first and second external electrodes 131 and 132.

The capacitor body 110 is obtained by stacking a plurality of dielectric layers 111 in the Z direction, followed by sintering, and includes a plurality of dielectric layer 111, and first and first internal electrodes 121 and 122 alternately disposed in the Z direction with the dielectric layer 111 interposed therebetween.

In this case, the dielectric layers 111 of the capacitor body 110, adjacent to each other, may be integrated so that a boundary therebetween cannot be confirmed.

The capacitor body 110 may have a substantially hexahedral shape, but an embodiment thereof is not limited thereto.

In this embodiment, for convenience of description, both surfaces of the capacitor body 110 opposing each other in the Z direction may be defined as first and second surfaces 1 and 2, both surfaces of the capacitor body 10 connected to the first and second surfaces 1 and 2 and opposing each other in the X direction may be defined as third and fourth surfaces 3 and 4, and both surfaces thereof connected to the first and second surfaces 1 and 2, connected to the third and fourth surfaces 3 and 4 and opposing each other in the Y direction may be defined as fifth and sixth surfaces 5 and 6. In this embodiment, the first surface 1 may be a mounting surface.

In addition, the dielectric layer 111 may include a ceramic material having a high dielectric constant, and may include, for example, $BaTiO_3$-based ceramic powder or the like, but an embodiment thereof is not limited thereto.

The $BaTiO_3$-based ceramic powder is, for example, $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$ or the like, in which calcium (Ca), zirconium (Zr) or the like is partially solid-dissolved in $BaTiO_3$, but an embodiment thereof is not limited thereto.

A ceramic additive, an organic solvent, a plasticizer, a binder, a dispersant, and the like may be further added to the dielectric layer 111, together with the ceramic powder.

As the ceramic additive, for example, transition metal oxide or transition metal carbide, a rare earth element, magnesium (Mg), aluminum (Al) or the like may be used.

Covers 112 and 113 having a predetermined thickness may be further formed on both sides of the capacitor body 110 in the Z direction.

Upper and lower covers 112 and 113 may be formed by a single dielectric layer or by stacking two or more dielectric layers on an upper surface of a capacitor portion, and may basically serve to prevent the first and second internal electrodes 121 and 122 by physical or chemical stress.

Referring to FIGS. 2A and 2B, the first and second internal electrodes 121 and 122 are electrodes having different polarities, and may be formed by printing a conductive paste containing a conductive metal on the dielectric layer 111 at a predetermined thickness. The first and second internal electrodes 121 and 122 may be disposed horizontally with respect to the first surface 1 in a stacking direction of the dielectric layers 111, in such a manner that one ends thereof are alternately exposed through the third and fourth surfaces 3 and 4.

In this case, the first and second internal electrodes 121 and 122 may be electrically insulated from each other by the dielectric layer 111 disposed therebetween.

The end portions of the first and second internal electrodes 121 and 122 alternately exposed through the third and fourth surfaces 3 and 4 of the capacitor body 110 may be electrically connected to first and second connection portions 131a and 132a of first and second external electrodes 131 and 132, respectively, disposed on the third and fourth surfaces 3 and 4 of the capacitor body 110, respectively.

In this case, the first and second internal electrodes 121 and 122 may be formed of a conductive metal, for example, a material such as nickel (Ni) or a nickel (Ni) alloy, but an embodiment thereof is not limited thereto.

The material of the first and second internal electrodes 121 and 122 is not particularly limited. For example, the first and second internal electrodes 121 and 122 may be formed using a precious metal material such as platinum (Pt), palladium (Pd), and a palladium-silver (Pd—Ag) alloy and a conductive paste formed of at least one of nickel (Ni) and copper (Cu).

In this case, as the printing method of the conductive paste, a screen-printing method, a gravure printing method or the like may be used, but an embodiment thereof is not limited thereto.

In the configuration described above, when a predetermined voltage is applied to the first and second external electrodes 131 and 132, charges are accumulated between the first and second internal electrodes 121 and 122 facing each other.

In this case, the capacitance of the multilayer capacitor 100 is proportional to an overlapped area of the first and second internal electrodes 121 and 122 overlapping each other in the Z direction.

The first and second external electrodes 131 and 132 may be provided with voltages having different polarities, and may be electrically connected to exposed portions of the first and second internal electrodes 121 and 122, respectively.

Plating layers may be formed on the surfaces of the first and second external electrodes 131 and 132 as necessary.

For example, each of the first and second external electrodes 131 and 132 may include a conductive layer, a nickel (Ni) plating layer formed on the conductive layer, and a tin (Sn) plating layer formed on the nickel plating layer.

The first external electrode 131 may include the first connection portion 131a and a first band portion 131b.

The first connection portion 131a is a portion disposed on the third surface 3 of the capacitor body 110 and connected to the first internal electrode 121 exposed through the third surface 3 of the capacitor body 110.

The first band portion 131b is a portion extending from the first connection portion 131a to portions of the fifth and sixth surfaces 5 and 6 of the capacitor body 110.

In addition, when the overall length of the multilayer capacitor 100 in the X direction, connecting the third surface 3 and the fourth surface 4, is defined as L0, a length L1 of the first band portion 131b in the X direction may be 0.15×L0 to 0.4×L0.

TABLE 1

| L1/L0 | Acoustic Noise [dBA] | Chip Mounting Failure | Poor Electrode Adhesion |
|---|---|---|---|
| 0.1 | 27.1 | Yes | No |
| 0.15 | 27.5 | No | No |
| 0.2 | 27.2 | No | No |
| 0.3 | 26.8 | No | No |
| 0.4 | 26.9 | No | No |
| 0.45 | 27.4 | No | Yes |

As illustrated in Table 1, when L1/L0 is less than 0.15, a portion of the substrate bonded to the electrode pad is too small at the time of mounting the multilayer capacitor on the substrate, chip mounting defects may occur. Further, when L1/L0 exceeds 0.45 a defect in which the first external electrode and the second external electrode stick together in manufacturing the multilayer capacitor may occur.

The second external electrode 132 may include the second connection portion 132a and a second band portion 132b.

The second connection portion 132a is a portion disposed on the fourth surface 4 of the capacitor body 110 and connected to the second internal electrode 122 exposed through the fourth surface 4 of the capacitor body 110.

The second band portion 132b is a portion extending from the second connection portion 132a to portions of the fifth and sixth surfaces 5 and 6 of the capacitor body 110.

A length L1 of the second band portion 132b in the X direction may be 0.15×L0 to 0.4×L0.

A distance G1 between the first band portion 131b and the second band portion 132b in the X direction may be 0.2×L0 to 0.7×L0.

When the distance G1 between the first band portion 131b and the second band portion 132b is less than 0.2×L0, a mounting failure may occur when the multilayer capacitor is mounted on the substrate, and the distance G1 between the first band portion 131b and in the case that the second band portion 132b exceeds 0.7×L0, a short failure may occur. The distance G1 may be less than a distance, along one of the first and second surfaces, between the first and second external electrodes 131 and 132.

FIG. 4 is a cross-sectional view of a multilayer capacitor according to another embodiment.

In this case, since the structure of a capacitor body 110 is similar to that in the above-described embodiment, a detailed description thereof will be omitted to avoid duplication, and first and second external electrodes 131' and 132' having a structure different from that in the above-described embodiment will be described in detail.

In the embodiment with reference to FIG. 4, the first external electrode 131' may further include a third band portion 131c extending from a first connection portion 131a to a portion of a first surface 1 of the capacitor body 110.

The third band portion 131c may be formed to extend to a portion of a second surface 2 of the capacitor body 110 to remove the vertical direction when necessary.

In this case, a length L2 of a first band portion 131b' may be greater than a length L3 of the third band portion 131c.

The second external electrode 132' may further include a fourth band portion 132c extending from a second connection portion 132a to a portion of the first surface 1 of the capacitor body 110.

The fourth band portion 132c may be formed to extend to a portion of the second surface 2 of the capacitor body 110 to remove the vertical direction when necessary.

In this case, a length L2 of the second band portion 132b' may be greater than a length L3 of the fourth band portion 132c.

In this embodiment, a distance G2 between the first band portion 131b' and the second band portion 132b' may be 0.2×L0 to 0.8×L0. The distance G2 may be less than a distance, along one of the first and second surfaces, between the first and second external electrodes 131' and 132'.

When the distance G2 between the first band portion 131b' and the second band portion 132b' is less than 0.2×L0, a mounting failure may occur when the multilayer capacitor is mounted on the substrate, and when the distance G2 between the first band portion 131b' and the second band portion 132b' exceeds 0.8×L0, a short failure may occur.

The ratio of the length L3 of the third band portion 131c to the length L2 of the first band portion 131b', and the ratio of the length of the fourth band portion 132c to the length of the second band portion 132b', may each be 0.13<(L3/L2)<0.67.

TABLE 2

| G2/L0 | L3/L2 | A/N |
|---|---|---|
| 0.8 | 0.5 | 28.9 |
| | 1.0 | 36.1 |
| | 2.0 | 39.1 |
| | 3.0 | 46.3 |
| | 4.0 | 48.9 |

TABLE 2-continued

| G2/L0 | L3/L2 | A/N |
|---|---|---|
| 0.6 | 0.3 | 29.5 |
| | 0.5 | 33.7 |
| | 1.0 | 37.4 |
| | 1.5 | 41.2 |
| | 2.0 | 45.9 |
| 0.4 | 0.17 | 23.1 |
| | 0.33 | 27.8 |
| | 0.67 | 34.7 |
| | 1.00 | 40.3 |
| | 1.33 | 45.8 |
| 0.2 | 0.13 | 27.1 |
| | 0.25 | 28.5 |
| | 0.5 | 33.4 |
| | 0.75 | 41.2 |
| | 1.0 | 46.5 |

As illustrated in Table 2 above, as a result of changing the ratio of the length L3 of the third band portion 131c to the length L2 of the first band portion 131b' while adjusting G2, it can be seen that acoustic noise characteristics appear as low as 35 dB or less in the case of 0.13<L3/L2<0.67.

Since the ratio of the length of the fourth band portion 132c to the length of the second band portion 132b' is similar to the ratio of the length of the third band portion 131c to the length of the first band portion 131b', detailed descriptions thereof will be omitted.

As such, when the lengths of the first and second band portions 131b' and 132b' are greater than the lengths of the third and fourth band portions 131c and 132c, the bonding area with the substrate is relatively small at the time of performing substrate mounting, and thus, vibration transmission may be significantly reduced, and the areas of the first and second band portions 131b' and 132b' formed on both sides of the capacitor body 110 in the Y direction are relatively increased, thereby increasing the contact area with the solder to improve fixing strength.

Figure 5:
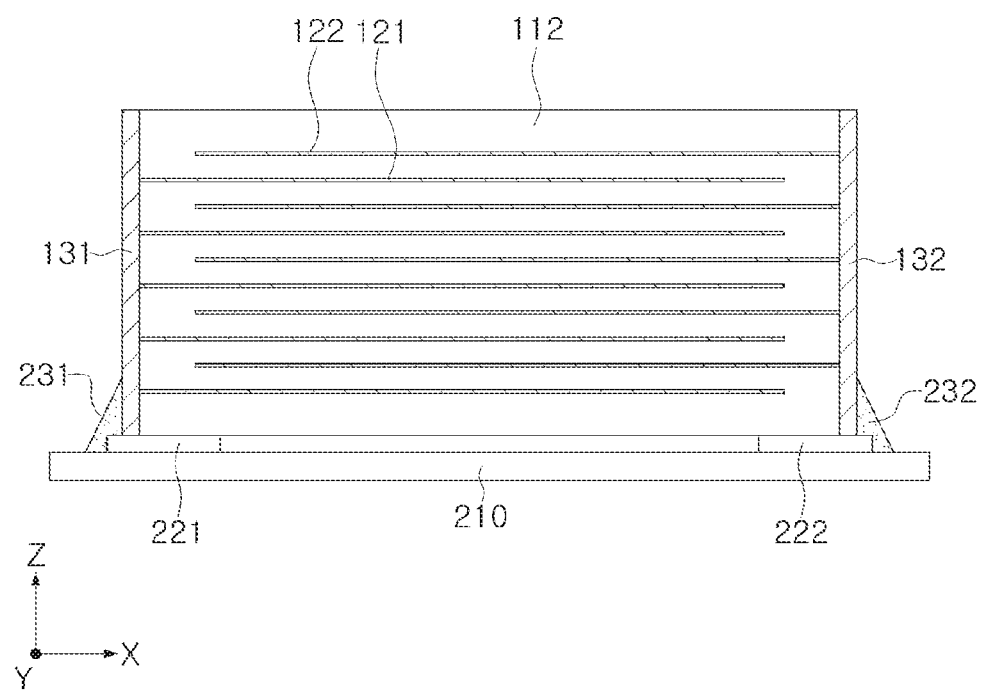
FIG. 5 is a cross-sectional view schematically illustrating a state in which a multilayer electronic component according to an embodiment is mounted on a substrate.

Referring to FIG. 5, a board having a multilayer capacitor mounted thereon according to this embodiment includes a substrate 210 having first and second electrode pads 221 and 222 on one surface thereof, and a multilayer capacitor.

In this case, lower surfaces of both ends of the capacitor body 110 are disposed on the first and second electrode pads 221 and 222, a first connection portion 131a and the first electrode pad 221 are connected to each other by a first solder 231, and a second connection portion 132a and the second electrode pad 222 are connected to each other by a second solder 232.

In this embodiment, the multilayer capacitor is illustrated as being mounted on the substrate 210 by the first and second solders 231 and 232, but a conductive paste may also be used instead of the solder if necessary.

In a state in which the multilayer capacitor is mounted on the substrate, when voltages having different polarities are applied to the first and second external electrodes formed on the multilayer capacitor, the capacitor body may expand and contract in the Z direction due to an inverse piezoelectric effect of the dielectric layer. In this case, both ends of the first and second external electrodes are contracted and expanded in the opposite direction to the expansion and contraction of the capacitor body in the Z direction by the Poisson effect.

The contraction and expansion cause vibrations. In addition, the vibrations are transmitted to the substrate from the first and second external electrodes, the sound is radiated from the substrate to become acoustic noise.

In general, a horizontal mounting multilayer capacitor has a larger deformation in the Z direction than a deformation in the X direction.

In the related art, there is a method of thickening a substrate or attaching a rigid substrate to the bottom of the MLCC to reduce vibrations.

However, in this case, although the vibrations may be partially reduced, there is a problem in which the overall thickness of the mounting substrate of the multilayer capacitor increases.

Figure 6:
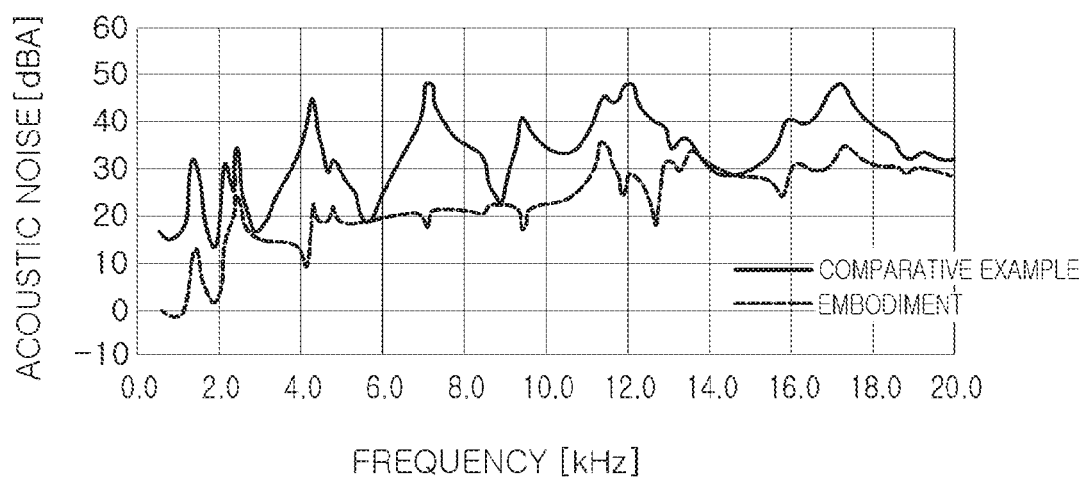
FIG. 6 is a graph illustrating a comparison of acoustic noise in a case in which related art multilayer capacitor is mounted on a substrate and in a case in which a multilayer capacitor of an embodiment is mounted on a substrate.

FIG. 6 is a graph illustrating a comparison of acoustic noise in a case in which related art multilayer capacitor is mounted on a substrate and in a case in which a multilayer capacitor of an embodiment is mounted on a substrate.

In FIG. 6, the multilayer capacitor has a length, a width and a thickness of 1.72 mm, 0.96 mm, and 1.01 mm, respectively, and the number of stacked internal electrodes is 380.

In the comparative example, the band portion is formed to have the same length on all of the first, second, fifth and sixth surfaces of the capacitor body, and in the embodiment of the present disclosure, the band portion is formed only on the fifth and sixth surfaces of the capacitor body.

Referring to FIG. 7, it can be seen that in the comparative example, acoustic noise is 40.3 dB on average, and in the embodiment, acoustic noise is relatively lower in average 26.8 dB in most frequency regions.

According to this embodiment, the external electrode is not formed on the mounting surface of the capacitor body or is formed to have a minimum size on the mounting surface, and the external electrodes are formed on both end surfaces of the capacitor body in the X direction and both sides of the capacitor body in the Y direction.

Therefore, since it is not necessary to increase the thickness of the multilayer capacitor to increase rigidity, the multilayer capacitor having a small thickness while implementing low noise performance may be manufactured.

Therefore, according to the structure of the multilayer electronic component in this embodiment, the acoustic noise reduction structure may effectively suppress the amount of vibrations that the piezoelectric vibrations of the multilayer electronic component is transmitted to the substrate at an audible frequency of the multilayer electronic component within 20 kHz.

In addition, by reducing the high frequency vibrations of multilayer electronic components, malfunctions of sensors that may be problematic by high frequency vibrations of 20 kHz or higher of electronic components may be prevented in IT or industrial/electric and electronic fields, and internal fatigue accumulation due to long time vibrations of sensors may be suppressed.

As set forth above, according to embodiments, acoustic noise in an audible frequency region of less than 20 kHz and high frequency vibrations of 20 kHz or more in a multilayer in a multilayer electronic component may be reduced.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A multilayer capacitor comprising:
a capacitor body having first and second surfaces opposing each other, third and fourth surfaces connected to the first and second surfaces and opposing each other, and fifth and sixth surfaces connected to the first and second surfaces, connected to the third and fourth surfaces and opposing each other, the capacitor body including a dielectric layer and first and second internal electrodes having one ends exposed through the third and fourth sides, respectively; and
first and second external electrodes including first and second connection portions disposed on the third and fourth surfaces of the capacitor body, respectively, and first and second band portions extending from the first and second connection portions to portions of the fifth and sixth surfaces of the capacitor body, respectively,
wherein a first distance, along one of the fifth and sixth surfaces, between the first and second external electrodes, is less than a second distance, along one of the first and second surfaces, between the first and second external electrodes,
the first and second external electrodes further comprise third and fourth band portions extending from the first and second connection portions to portions of the first surface of the capacitor body, respectively, and
a ratio of a length of the third band portion to a length of the first band portion, and a ratio of a length of the fourth band portion to the length of a second band portion are each greater than 0.13 and less than 0.67.

2. The multilayer capacitor of claim 1, wherein a length of each of the first band portion and the second band portion is from 0.15×L0 to 0.4×L0, in which L0 is a length of the multilayer capacitor in a direction connecting the third and fourth surfaces.

3. The multilayer capacitor of claim 1, wherein the first distance between the first band portion and the second band portion is from 0.2×L0 to 0.7×L0, in which L0 is a length of the multilayer capacitor in a direction connecting the third surface and the fourth surface.

4. The multilayer capacitor of claim 1, wherein the first distance between the first band portion and the second band portion is from 0.2×L0 to 0.8×L0, in which L0 is a length of the multilayer capacitor in a direction connecting the third and fourth surfaces.

5. The multilayer capacitor of claim 1, wherein each of the first and second external electrodes further comprises a plating layer.

6. A board having a multilayer capacitor mounted thereon, the board comprising:
a substrate including first and second electrode pads on one surface of the substrate; and
a capacitor body having first and second surfaces opposing each other, third and fourth surfaces connected to the first and second surfaces and opposing each other, and fifth and sixth surfaces connected to the first and second surfaces, connected to the third and fourth surfaces and opposing each other, the capacitor body including a dielectric layer and first and second internal electrodes having one ends exposed through the third and fourth sides, respectively; and first and second external electrodes including first and second connection portions disposed on the third and fourth surfaces of the capacitor body, respectively, and first and second band portions extending from the first and second connection portions to portions of the fifth and sixth surfaces of the capacitor body, respectively, wherein a first distance, along one of the fifth and sixth surfaces, between the first and second external electrodes, is less than a second distance, along one of the first and second surfaces, between the first and second external electrodes, the capacitor body is disposed on the first and second electrode pads, the board further comprises a first solder connecting the first connection portion and the first electrode pad to each other, and a second solder connecting the second connection portion and the second electrode pad to each other, the first and second external electrodes further comprise third and fourth band portions extending from the first and second connection portions to portions of the first surface of the capacitor body, respectively, and a ratio of a length of the third band portion to a length of the first band portion, and a ratio of a length of the fourth band portion to a length of the second band portion, are each greater than 0.13 and less than 0.67.

7. The board of claim 6, wherein lengths of the first band portion and the second band portion are each from 0.15×L0 to 0.4×L0, in which L0 is a length of the multilayer capacitor in a direction connecting the third and fourth surfaces.

8. The board of claim 6, wherein the first distance between the first band portion and the second band portion is 0.2×L0 to 0.7×L0, in which L0 is a length of the multilayer capacitor in a direction connecting the third and fourth surfaces.

9. The board of claim 6, wherein the first distance between the first band portion and the second band portion is 0.2×L0 to 0.8×L0, in which L0 is a length of the multilayer capacitor in a direction connecting the third and fourth surfaces.

10. The board of claim 6, wherein the first and second external electrodes further comprise a plating layer.

* * * * *